United States Patent
Chen et al.

(10) Patent No.: US 11,683,910 B2
(45) Date of Patent: Jun. 20, 2023

(54) HOT PLUG REDUNDANT PUMP FOR COOLING SYSTEM

(71) Applicant: Quanta Computer Inc., Taoyuan (TW)

(72) Inventors: Chao-Jung Chen, Taoyuan (TW); Yu-Nien Huang, Taoyuan (TW); Huan-Shu Chien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 35 days.

(21) Appl. No.: 17/444,802

(22) Filed: Aug. 10, 2021

(65) Prior Publication Data
US 2022/0346271 A1 Oct. 27, 2022

Related U.S. Application Data

(60) Provisional application No. 63/180,468, filed on Apr. 27, 2021.

(51) Int. Cl.
*H05K 7/20* (2006.01)

(52) U.S. Cl.
CPC ..... *H05K 7/20272* (2013.01); *H05K 7/20281* (2013.01); *H05K 7/20763* (2013.01)

(58) Field of Classification Search
CPC ........... H05K 7/20272; H05K 7/20281; H05K 7/20763
USPC .................................................. 361/679.46
See application file for complete search history.

(56) References Cited

U.S. PATENT DOCUMENTS

| | | | | |
|---|---|---|---|---|
| 4,865,123 A * | 9/1989 | Kawashima | ....... | H05K 7/20272 165/104.19 |
| 6,807,056 B2 * | 10/2004 | Kondo | ............... | H05K 7/20781 361/689 |
| 7,149,084 B2 * | 12/2006 | Matsushima | ........... | G06F 1/206 174/15.1 |
| 7,385,810 B2 * | 6/2008 | Chu | ..................... | H05K 7/2079 361/679.48 |
| 7,420,804 B2 * | 9/2008 | Leija | .................. | H05K 7/20772 361/679.48 |

(Continued)

FOREIGN PATENT DOCUMENTS

| | | |
|---|---|---|
| CN | 109906018 A | 6/2019 |
| JP | 2019067104 A | 4/2019 |
| JP | 2020154360 A | 9/2020 |

OTHER PUBLICATIONS

TW Search Report for Application No. 111101581, dated Jun. 20, 2022, w/ First Office Action.

*Primary Examiner* — Anatoly Vortman
(74) *Attorney, Agent, or Firm* — Nixon Peabody LLP

(57) ABSTRACT

A coolant distribution unit providing reliant circulation of coolant in a liquid cooling system for a heat-generating component such as a computer server is disclosed. The coolant distribution unit includes a manifold unit having a supply connector to supply coolant to the heat-generating component and a collection connector to collect coolant from a heat exchanger. A first pump has an inlet coupled to the manifold unit and an outlet coupled to the manifold unit. The first pump circulates coolant from the inlet to the outlet. A second pump has an inlet coupled to the manifold unit and an outlet coupled to the manifold. The second pump circulates coolant from the inlet to the outlet. The second pump may be disconnected from the manifold unit, while the first pump continues to circulate coolant through the manifold unit.

17 Claims, 9 Drawing Sheets

(56) References Cited

U.S. PATENT DOCUMENTS

| | | | | |
|---|---|---|---|---|
| 7,885,070 B2* | 2/2011 | Campbell | H05K 7/20809 | 361/698 |
| 8,369,090 B2* | 2/2013 | Chester | H05K 7/20763 | 165/80.4 |
| 8,430,156 B2* | 4/2013 | Malone | H01L 23/473 | 165/300 |
| 9,291,408 B2* | 3/2016 | Iyengar | F28D 1/0475 | |
| 10,225,958 B1* | 3/2019 | Gao | H05K 7/20781 | |
| 10,813,253 B2* | 10/2020 | Lunsman | H05K 7/20254 | |
| 10,925,190 B2* | 2/2021 | Gao | H05K 7/20254 | |
| 2005/0244280 A1* | 11/2005 | Malone | H05K 7/20772 | 257/E23.098 |
| 2007/0209782 A1* | 9/2007 | Wyatt | H05K 7/20827 | 165/104.31 |
| 2014/0069616 A1* | 3/2014 | Wajima | F28F 9/005 | 165/120 |
| 2014/0231061 A1* | 8/2014 | Barringer | H05K 7/20272 | 165/96 |
| 2016/0153595 A1* | 6/2016 | Arvelo | F15D 1/00 | 285/332 |
| 2016/0242326 A1* | 8/2016 | Edwards | F04D 25/16 | |
| 2016/0341342 A1* | 11/2016 | Arvelo | H05K 7/20772 | |
| 2017/0049009 A1* | 2/2017 | Steinke | H05K 7/20736 | |
| 2019/0182988 A1* | 6/2019 | Lunsman | H05K 7/20272 | |
| 2019/0373776 A1* | 12/2019 | Gao | H05K 7/20772 | |
| 2020/0154610 A1* | 5/2020 | Wilks | H05K 7/2079 | |
| 2020/0191504 A1* | 6/2020 | Chen | H05K 7/20781 | |

* cited by examiner

HOT PLUG REDUNDANT PUMP FOR COOLING SYSTEM

CROSS-REFERENCE TO RELATED APPLICATIONS

This application claims priority from and benefit of U.S. Provisional Patent Application Ser. No. 63/180,468, filed on Apr. 27, 2021, titled "Hot Plug Redundant Pump Design," which is hereby incorporated by reference herein in its entirety.

TECHNICAL FIELD

The present invention relates generally to liquid cooling systems, and more specifically, to a coolant distribution unit having a redundant pump, allowing a liquid cooling system to function when a pump is taken off-line.

BACKGROUND

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling, in combination with fan systems, is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK, while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In rack level liquid cooling system designs, the cooling liquid source includes a closed loop cooling system and an open loop cooling system to facilitate heat exchange. Known closed loop liquid cooling systems use heat exchange to cool hot water, which is heated from the heat source. Heat is then removed from the hot water in the closed loop liquid cooling system via an open loop system such as a radiator in proximity to a fan wall. The closed loop cooling system includes a heat source such as a computer system and a heat exchanger. A liquid flow pipe carries coolant liquid to the heat source. Heat generated by the heat source is transferred to the coolant liquid. A liquid flow pipe carries heated liquid away from the heat source. The heat exchanger has a radiator where the returned coolant flows. The radiator transfers heat from the heated liquid and thus results in cooler liquid to be circulated to the liquid flow pipe. An open loop air cooling system, such as a fan wall, generates air flow that carries away heat absorbed by the radiator of the heat exchanger.

When using liquid to cool a server system, pumps are required to circulate the coolant into the heat source, into the liquid flow pipes, and through the heat exchanger. The liquid cooling system requires the pump to remain operational at all times to circulate the coolant. In current liquid cooling systems, operators need to shut down the computer system to repair or replace the pump. Thus, current liquid cooling systems may result in unnecessary computer downtime when pumps require replacement.

Thus, there is a need for a coolant distribution unit for a liquid cooling system that allows continual operation of a computer system even when a pump is being replaced. There is another need for a mechanism to divert coolant circulation to an operational pump while another pump is taken off line. There is also another need for a coolant distribution unit that allows removal of a redundant pump without coolant leaks.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example coolant distribution unit providing circulation of coolant in a liquid cooling system for a heat-generating component is disclosed. The coolant distribution unit includes a manifold unit having a supply connector to supply coolant to the heat-generating component and a collection connector to collect coolant from a heat exchanger. A first pump has an inlet coupled to the manifold unit and an outlet coupled to the manifold unit. The first pump circulates coolant from the inlet to the outlet. A second pump has an inlet coupled to the manifold unit and an outlet coupled to the manifold. The second pump circulates coolant from the inlet to the outlet. The second pump may be disconnected from the manifold unit, while the first pump continues to circulate coolant through the manifold unit.

A further implementation of the example coolant distribution unit is where each of the inlets and the outlets of the first and second pumps are coupled to the manifold unit via a quick connector. The quick connectors of the inlet and outlet of the second pump closes off the manifold unit from coolant leaks when the second pump is disconnected. Another implementation is where the manifold unit includes a merge manifold coupled to the inlets of the first and second pumps and a separation manifold coupled to the outlets of the first and second pumps. Another implementation is where the example coolant distribution unit further includes a third pump having an inlet coupled to the manifold unit and an outlet coupled to the manifold unit. The third pump circulates coolant from the inlet to the outlet. The third pump continues to circulate coolant when the second pump is disconnected from the manifold unit. Another implementation is where the example coolant distribution unit includes a controller coupled to the first pump and the second pump. The controller is configured to adjust the circulation flow rate of the first pump when the second pump is disconnected. Another implementation is where the controller is a programmable logic device. Another implementation is where the heat-generating component includes a heat-generating computational unit and internal conduits to circulate the coolant received from the manifold unit. Another implementation is where the heat-generating component is one of an application server, a storage server, a storage device, or a network switch. Another implementation is where the example coolant distribution unit includes a housing having an open end. The housing holds the first and second pumps. The first and second pumps may be removed from the housing from the open end.

According to certain aspects of the present disclosure, an example computer system is disclosed. The computer system includes a computer component having a heat-generating device, a conduit to circulate coolant, a hot coolant connector, and a cold coolant connector. A heat exchanger is configured to receive hot coolant from the hot coolant connector and supply cooled coolant. A manifold unit is fluidly coupled to the heat exchanger to receive the cooled coolant and supply the cooled coolant to the cold coolant connector. A pump module is coupled to the manifold unit to circulate the coolant between the heat exchanger, the manifold unit, and the computer component. The pump module includes a first pump having an inlet coupled to the manifold unit and an outlet coupled to the manifold unit. The first pump circulates the coolant from the inlet to the outlet. A second pump has an inlet coupled to the manifold unit and an outlet coupled to the manifold unit. The second pump circulates the coolant from the inlet to the outlet. The second pump may be disconnected from the manifold unit, while the first pump continues to circulate the coolant.

A further implementation of the example computer system is where each of the inlets and the outlets of the first and second pumps are coupled to the manifold unit via a quick connector. The quick connectors of the inlet and outlet of the second pump close off the manifold unit from coolant leaks when the second pump is disconnected. Another implementation is where the manifold unit includes a merge manifold coupled to the inlets of the first and second pumps and a separation manifold coupled to the outlets of the first and second pumps. Another implementation is where the pump module further includes a third pump having an inlet coupled to the manifold unit and an outlet coupled to the manifold unit. The third pump circulates coolant from the inlet to the outlet. The third pump continues to circulate coolant when the second pump is disconnected from the manifold unit. Another implementation is where the example computer system further includes a controller coupled to the first pump and the second pump. The controller is configured to adjust the circulation flow rate of the first pump when the second pump is disconnected. Another implementation is where the controller is a programmable logic device. Another implementation is where the computer component includes internal conduits to circulate the coolant received from the manifold unit. Another implementation is where the computer component is one of an application server, a storage server, a storage device, or a network switch. Another implementation is where the computer system further includes a coolant distribution unit having a housing. The housing holds the manifold unit and the pump module. Another implementation is where the example computer system includes a rack holding the computer component, the manifold unit and the pump module. The rack includes a door holding the heat exchanger.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
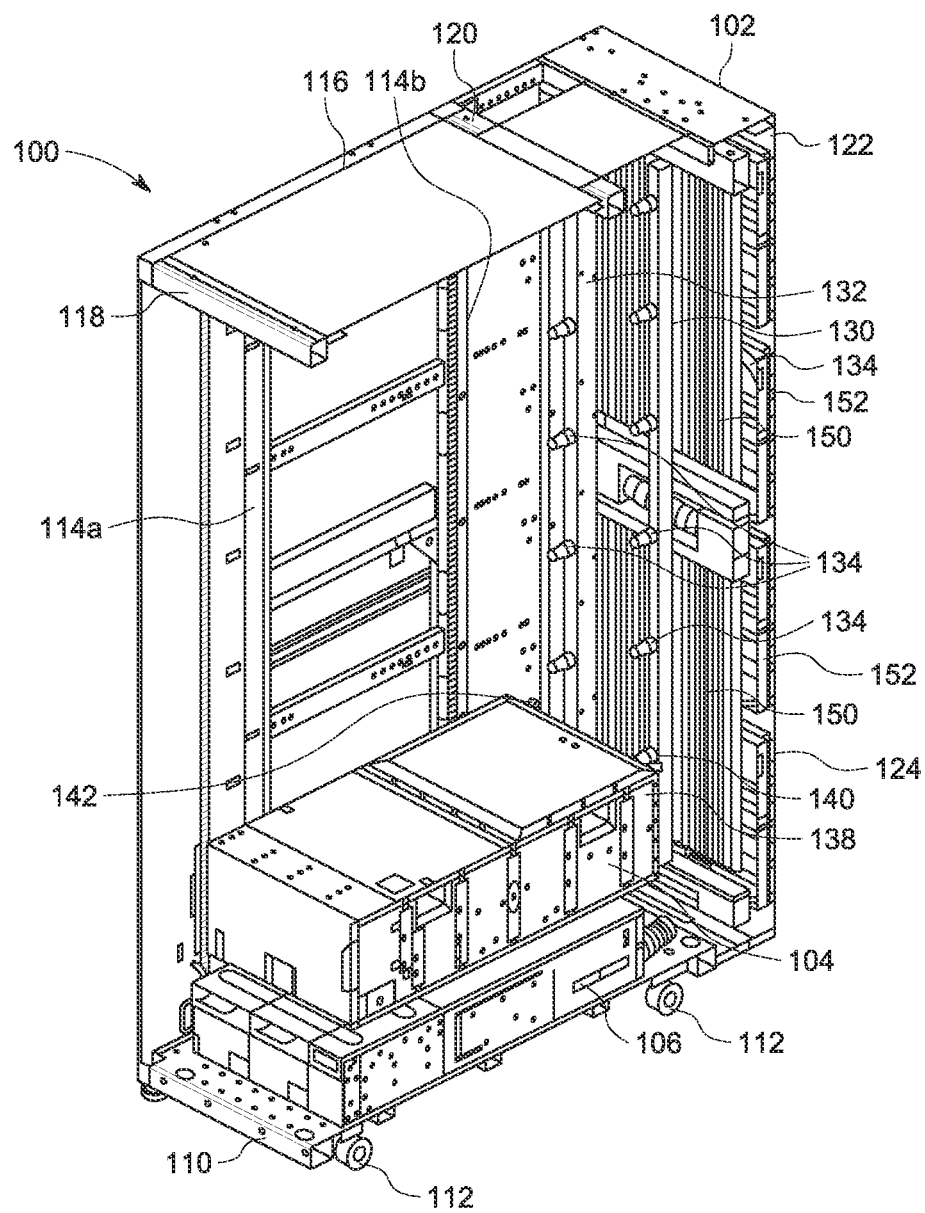
FIG. 1 is a perspective partial cutaway view of a computer system with a liquid cooling system, according to certain aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a coolant distribution unit of a liquid cooling system. The coolant distribution unit has at least two hot-swappable pump modules that circulate liquid coolant to a manifold unit. Each of the pump modules has a pair of quick connectors for the liquid coolant. The manifold unit (i) separates the received liquid coolant into the two pumps, and (ii) merges the now pressurized liquid coolant from the two pumps into a coolant supply connector. The pressurized liquid coolant is then circulated to components that require cooling such as computer servers. When a pump requires service, an operator may detach the pair of quick connectors. The manifold unit will thus route liquid coolant through the remaining pump for providing circulation, allowing the cooling system to continue operation.

FIG. 1 is a partial cutaway view that shows an example computer system 100 that includes a rack 102, a heat-generating component 104, and a coolant distribution unit 106. Although only one heat-generating component 104 is shown for ease of illustration, it is understood that the rack 102 may hold numerous heat-generating components that are stacked over the coolant distribution unit 106. In this example the heat-generating component 104 may be a computer component such as a storage server, an application server, a network switch, or any other electronic device. Each of the heat-generating components such as the heat-generating component 104, has a fully sealed chassis to allow circulation of coolant to cool internal elements in the chassis by a liquid cooling system.

The rack 102 includes a rectangular bottom frame 110. The bottom frame 110 includes a set of wheels 112 attached to the bottom of the frame 110. The wheels 112 allow the rack 102 to be moved to desired locations in a data center. Side members of the bottom frame 110 support vertical supports 114*a*, 114*b*, defining one side of the rack 102. Similar vertical supports are provided on the other side of the rack 102 omitted from the view in FIG. 1. A top panel 116 connects the tops of the vertical supports 114*a* and 114*b*. The top panel 116 holds lateral bracing members 118 and 120, which connect the tops of the vertical supports 114*a* and 114*b* to the vertical supports of the opposite side of the rack 102. Each of the vertical supports 114*a* and 114*b* may include holes to allow pins to be inserted. The pins may support shelves that may be installed between (i) the supports 114*a* and 114*b* and (ii) the corresponding supports on the other side of the rack 102. The support 114*b* is near a rear end of the rack 102 that includes a rear door 122. The rear door 122 may be opened to allow access to the rear sides of the components stored in the rack 102. As will be explained the rear door 122 supports a heat exchanger 124 that is part of the liquid cooling system of the rack 102.

The support 114*a* is close to an open front end of the rack 102. The component 104 and the coolant distribution unit 106 are generally installed from the front end of the rack 102 between the supports on one of the shelves. The components thus may be pushed into the rack 102 until they contact a stop mechanism. The individual component 104, as well as the coolant distribution unit 106, may also be pulled out of the rack 102 from the front of the rack 102, between the supports such as the support 114*a*, for replacement or service.

The coolant distribution unit 106 is mounted on the bottom frame 110, under the stack of heat-generating components such as the component 104, in this example. The coolant distribution unit 106 may have replaceable modules such as pumps that may be inserted from the front end of the rack 102. Each of the shelves attached to the supports 114*a* and 114*b* may hold one or more of the heat-generating components. The shelves may be arranged to have different heights between the shelves. It is understood that any number of shelves and corresponding heat-generating components may be installed in the rack 102. In this example, the placement of the component 104 in the rack 102 is in a horizontal orientation. However, with additional internal structures connected to the supports 114*a* and 114*b*, the heat-generating component 104 could be in a vertical orientation.

The rack 102 supports a cold manifold 130 and a hot manifold 132, each of which extends over the height of the rack 102 at the rear of the rack 102 between the supports 114*a* and 114*b*. The cold manifold 130 is fluidly connected to the coolant distribution unit 106. The hot manifold 132 is fluidly connected to the heat exchanger 124. Each of the manifolds 130 and 132 can allow coolant to circulate along the respective length of the manifold. The manifolds 130 and 132 have respective fluid couplers 134 spaced at periodic intervals that allow fluid communication to one of the components such as the component 104.

The component 104 includes a fully sealed chassis 138 that encloses the electronics of the component 104. In this example, the rear of the chassis 138 of the component 104 includes an inlet connector 140, which may be connected to one of the fluid couplers 134 of the cold manifold 130. The rear of the chassis 138 also includes an outlet connector 142, which may be connected to one of the fluid couplers 134 of the hot manifold 132.

The fully sealed chassis 138 encloses electronic components, power supplies, circuit boards, device cards, processors, memory devices, and other elements. The chassis 138 may include an internal network of fluid conduits that circulate coolant around the internal elements of the component 104. The coolant is fully sealed by the chassis 138 and can only enter or exit the chassis 138 via the inlet connector 140 or the outlet connector 142.

For example, the component 104 may be an application server having processing devices such as CPUs and GPUs. The component 104 may include cold plates in contact with the CPUs and GPUs, as well as adjacent memory devices such as DIMMs. Coolant is circulated through the cold plates to carry away heat generated by the processing devices and memory devices. In this example, the individual heat-generating component 104 may be inserted on a shelf from the front of the rack 102. Once in place, the inlet connector 140 is fluidly connected with one of the couplers 134 of the cold manifold 130, and the outlet connector 142 is fluidly connected with one of the couplers 134 of the hot manifold 132. The component 104 may be connected to a power supply for power and other cables for carrying data signals. Any heat generating component such as a server, a storage device, a network switch, a router, and the like may be installed and cooled by the coolant supplied by the cold manifold 130.

The heat exchanger 124 in this example is part of the liquid cooling system and includes a series of radiators 150 that receive the heated coolant from the hot manifold 132. The radiators 150 allow the heated coolant to be cooled via a series of fan walls 152 that are mounted in proximity to each of the radiators 150. The cooled coolant exits from the radiators 150 and is routed to the coolant distribution unit 106.

The manifolds 130 and 132 circulate coolant to the component 104 through a closed loop formed with the coolant distribution unit 106 and the heat exchanger 124. Thus, the coolant liquid will flow into the component 104 from the inlet connector 140 from the cold manifold 130. The coolant will circulate through the internal conduits of the component 104 to absorb heat from the internal elements, and flow out of the component 104 through the outlet connector 142 to the hot manifold 132. The heated coolant will be circulated to the heat exchanger 124. The heat exchanger 124 removes the heat from the heated coolant via the radiators 150 and the fan wall 152. The cooled coolant is routed to the coolant distribution unit 106. The coolant distribution unit 106 includes a reservoir to store coolant and pumps to circulate the coolant through the manifolds 130 and 132 and the heat exchanger 124. The pumps in the coolant distribution unit 106 provide pressure to circulate the cooled coolant to the cold manifold 130.

Figure 2:
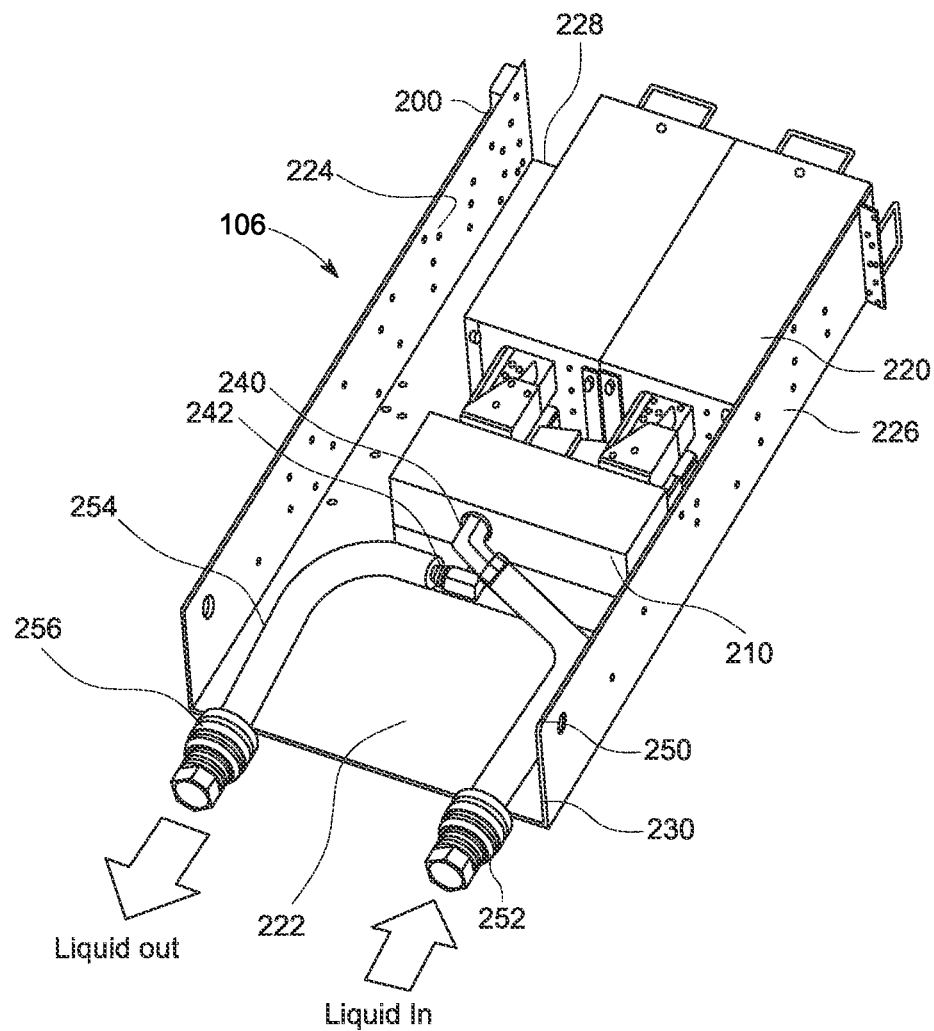
FIG. 2 is a perspective cutaway view of the pump module of the liquid cooling system in FIG. 1 with redundant pumps, according to certain aspects of the present disclosure.

FIG. 2 is a cutaway perspective view of the coolant distribution unit 106. The coolant distribution unit 106 includes a housing 200, a manifold unit 210 and a pump module 220. The housing 200 includes a bottom panel 222 and two side walls 224 and 226. The side walls 224 and 226 define a front end 228 and a rear end 230. The pump module 220 in this example includes at least two pumps, each of which may be inserted from the front end 228 of the housing 200. The pump module 220 (i) receives coolant from by the manifold unit 210 and (ii) provides circulatory pressure to the coolant to be supplied by the manifold unit 210 to the liquid cooling system.

The manifold unit 210 includes a collection connector 240 that receives coolant and a supply connector 242 that supplies pressurized coolant from the pump module 220. The collection connector 240 is connected to a hose 250 that has a connector 252 that may be fluidly connected to the heat exchanger 124 in FIG. 1 to receive the cooled coolant. The supply connector 242 is connected to a hose 254 that has a connector 256 that may be fluidly connected to the cold manifold 130 in FIG. 1 to supply coolant to the cold manifold 130. Thus, the supply connector 242 supplies coolant to heat-generating components such as the component 104 in FIG. 1.

Figure 3:
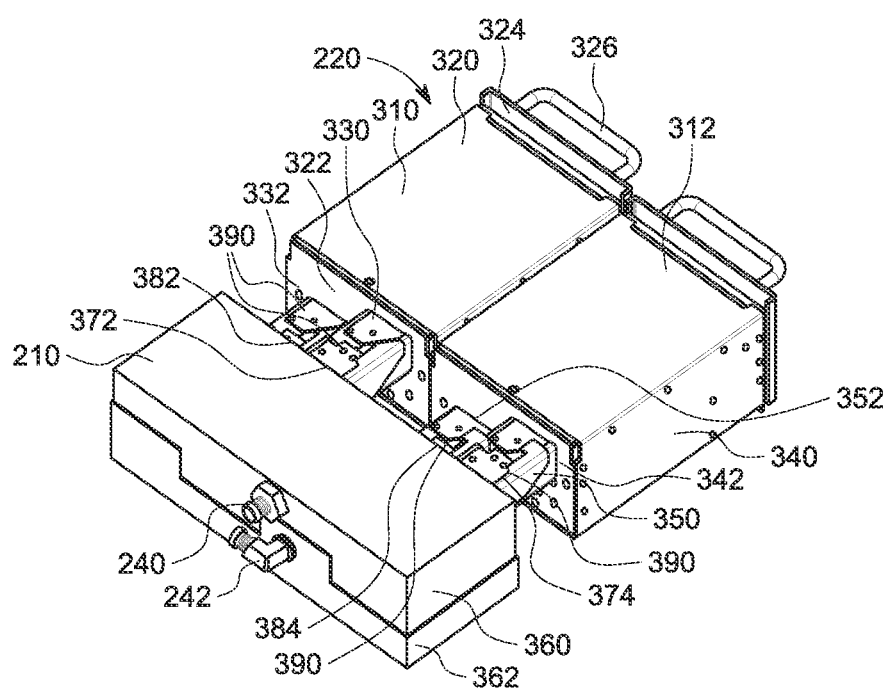
FIG. 3 is a perspective view of the example manifold unit and redundant pumps of the cooling system in FIG. 2 according to certain aspects of the present disclosure.

FIG. 3 is a perspective view of the manifold unit 210 and the pump module 220 in FIG. 2. In this example, the pump module 220 includes two pumps 310 and 312. Each of the pumps 310 and 312 are modular units and are identical to each other. The pumps 310 and 312 are controlled by a controller (not shown) to set the flow rate of the pumps 310 and 312. The pumps 310 and 312 of the pump module 220 circulate the liquid coolant through the manifold unit 210 as part of the closed loop cooling system described above. Although two pumps are provided in this example, it is to be understood that additional pumps may be used to increase overall flow rate of coolant circulated by the manifold unit 210.

The pump 310 has a rectangular housing 320 with a rear panel 322 and an opposite front panel 324. In this example, the rear panel 322 includes electrical connection interfaces for connection to a pump controller module and power inputs from a power source. The housing 320 is designed to be inserted in registration features on the bottom panel 222 of the housing 200 of the coolant distribution unit 106 in FIG. 2. In this example, the rack 102 in FIG. 1 may include a separate power source that may be connected to the pumps 310 and 312 through the rear panel 322. The front panel 324 also includes a handle 326 that facilitates the insertion or removal of the pump 310 from the housing 200 in FIG. 2 for replacement or maintenance.

The pump controller module may be a specialized controller such as a chassis management controller (CMC), or any other type of programmable controller device such as a complex programmable logic device (CPLD), an application specific integrated circuit (ASIC), or a field programmable gate array (FPGA) or general processor installed on the rack 102 in FIG. 1. If the pump controller is a dedicated specialized circuit device, such as an ASIC, the functions are designed in the hardware itself. If the controller includes programmable hardware such as a CPLD or an FPGA, the device hardware may be programmed before installation in the rack 102.

The front panel 324 has a liquid inlet 330 and a liquid outlet 332. The housing 320 encloses internal fluid conduits and a motor that impels the coolant received from the inlet 330 out through the outlet 332.

Similarly, the pump 312 has a housing 340 with a rear panel 342 with a liquid inlet 350 and a liquid outlet 352. The housing 340 encloses internal fluid conduits and a motor that impels the coolant received from the inlet 350 out through the outlet 352.

The manifold unit 210 includes a separation manifold 360 and a merge manifold 362. The separation manifold 360 and the merge manifold 362 are mated together, but are fluidly isolated from each other. The separation manifold 360 includes the collection connector 240. Coolant is received by the collection connector 240. Coolant is circulated through the separation manifold 360 and internally guided to one of two outlets 372 and 374 through internal conduits. In this example, the outlet 372 is fluidly coupled to the inlet 330 of the pump 310 while the outlet 374 is fluidly coupled to the inlet 350 of the pump 312.

The merge manifold 362 includes the supply connector 242. Coolant is supplied to the closed loop system by the supply connector 242. Coolant is supplied to the merge manifold 362 from one of two inlets 382 and 384. In this example, the inlet 382 is fluidly coupled to the outlet 332 of the pump 310 while the inlet 384 is fluidly coupled to the outlet 352 of the pump 312. Thus, coolant from the outlets 332 and 352 is merged in the merge manifold 362 via internal conduits and supplied thorough the supply connector 242.

In this example, a quick connection mechanism such as a quick connector 390 is provided to connect the outlet 372 of the manifold unit 210 to the inlet 330 of the pump 310. As explained below, the quick connection mechanism mechanically cuts off fluid communication when the connection is broken, thus allowing the pump 310 to be removed without coolant leaking. Other types of connectors may be used to connect the outlet 372 to the inlet 330.

Another quick connector 390 is provided to connect the outlet 374 of the manifold unit 210 to the inlet 350 of the pump 312. Another quick connector 390 is provided to connect the inlet 382 of the manifold unit 210 to the outlet 332 of the pump 310. Another quick connector 390 is provided to connect the inlet 384 of the manifold unit 210 to the outlet 352 of the pump 312.

Figure 4:
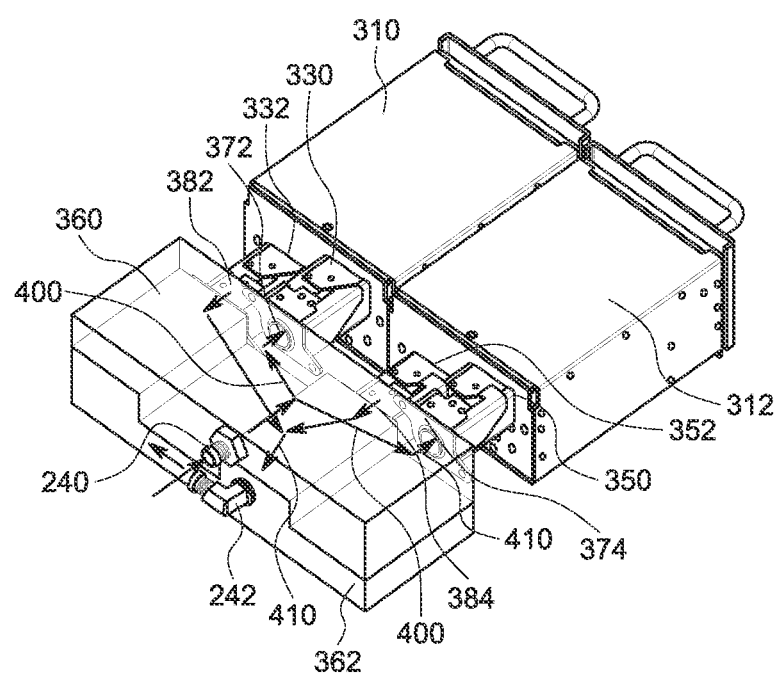
FIG. 4 is perspective view of the example manifold unit in FIG. 2 showing internal coolant flow to and from the two pumps according to certain aspects of the present disclosure.

FIG. 4 is a perspective view of the circulation of fluid through the pump module 220 and the manifold unit 210 during normal operation of the pump module 220. Like elements in FIG. 4 are labeled with like reference numbers from FIG. 3. The separation manifold 360 collects coolant from the connector 240. Arrows 400 show that the collected coolant is separated by the internal conduits in the separation manifold 360 to the outlets 372 and 374. The coolant from the outlet 372 is routed to the inlet 330 of the pumps 310 while the coolant from the outlet 374 is routed to the inlet 350 of the pump 312. The pumps 310 and 312 apply pressure to the coolant from the respective inlets 330 and 350 and circulates the coolant through the respective outlets 332 and 352.

The outlet 332 is fluidly connected to the inlet 382 of the merge manifold 362 while the outlet 352 is fluidly connected to the inlet 384. Arrows 410 show coolant that is circulated by the pumps 310 and 312 is supplied through the inlets 382 and 384 of the merge manifold 362. The merged coolant is available for the liquid cooling system through the supply connector 242.

In normal operation of the liquid cooling system for the computer system 100, coolant is supplied by the supply connector 242 from the merge manifold 362. The coolant is supplied through the separation manifold 360 which acts to route the coolant into the two pumps 310 and 312. The pumps 310 and 312 provide propulsive pressure and force the coolant from the merge manifold 362 to the separation manifold 360.

When one of the pumps 310 or 312 fails or requires maintenance, a user may remove the non-functioning pump. The two quick connectors 390 that connect each pump to the manifolds 360 and 362 close themselves and create a seal from coolant flowing into or out of the respective separation manifold 360 and the merge manifold 362 of the manifold unit 210. The remaining functional pump will keep circulating the liquid to the cooling system through the manifold unit 210. Once the new pump is installed by closing the quick connectors 390, the cooling system will return to a normal operation through both pumps. Thus, replacing a pump allows the computer system 100 to continue to operate because the closed loop cooling system remains operational on one of the pumps. Although the pump module 220 has two pumps 310 and 312, additional pumps may be added to provide greater coolant circulation. Additional inlets and outlets may therefore be provided in the manifold unit 210 to be connected to the additional pumps. When either pump 310 or 312 is removed, the remaining pumps remain in operation to circulate coolant.

Figure 5:
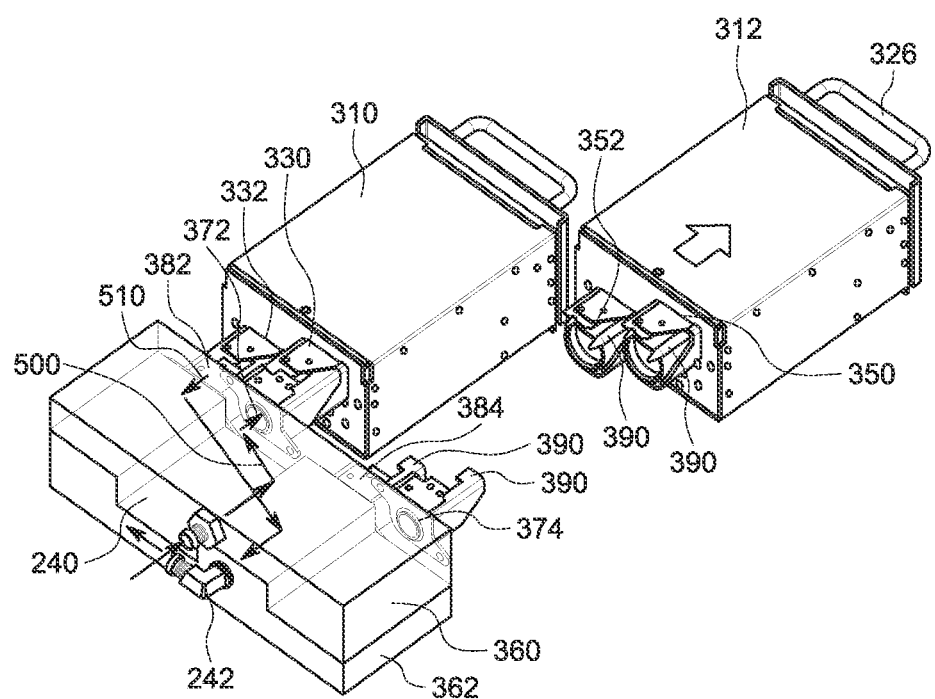
FIG. 5 is perspective view of the example manifold unit in FIG. 2 with one of the redundant pumps removed and the resulting diverted coolant flow according to certain aspects of the present disclosure.

FIG. 5 is a perspective view of the circulation of fluid through the pump module 220 and the manifold unit 210 when one of the pumps 312 is removed. Like elements in FIG. 4 are labeled with like reference numbers from FIG. 3. As explained above, the pump 312 may be pulled out of the housing 200 in FIG. 2 for replacement or repair. In such a process, the quick connector 390 that connects the inlet 350 of the pump 312 to the outlet 374 of the separation manifold 360 is closed to prevent coolant from leaking from the outlet 374 of the separation manifold 360. The quick connector 390 that connects the outlet 352 of the pump 312 to the inlet 384 of the merge manifold 362 is closed to prevent coolant from leaking from the inlet 384 of the merge manifold 362. The pump 312 may then be pulled out through the handle 326 from the housing.

Coolant as shown by arrows 500 continues to be received and circulated by the remaining pump 310 to the merge manifold 362 as shown by arrows 510. Thus, coolant continues to be received from the collection connector 240. The received coolant 500 is routed through internal conduits solely to the outlet 372 of the merge manifold 362 to the inlet 330 of the pump 310. The pump 310 pressurizes the received coolant, which is routed through the outlet 332 to the merge manifold 362 to the supply connector 242. In order to maintain the same circulation flow, the pressure provided by the pump 310 may be increased to compensate for the temporary unavailability of the removed pump 312.

Figure 6A:
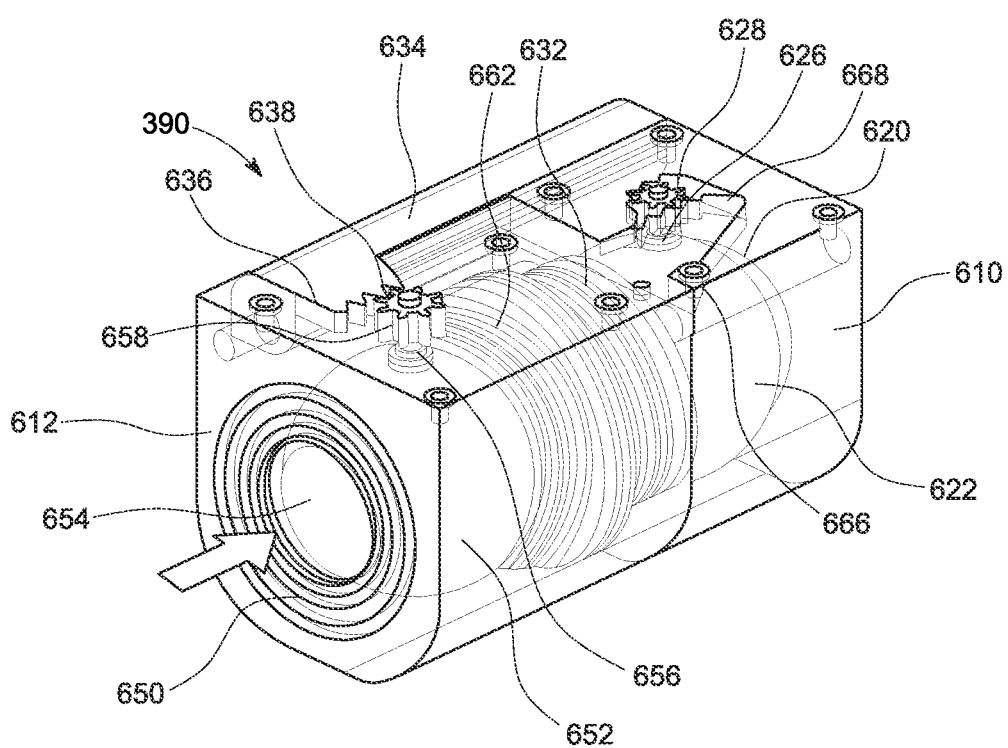
FIGS. 6A-6B are perspective view of one of the quick connects between the manifold unit and the pumps of FIG. 2 in connected and unconnected states, according to certain aspects of the present disclosure.
Figure 6B:
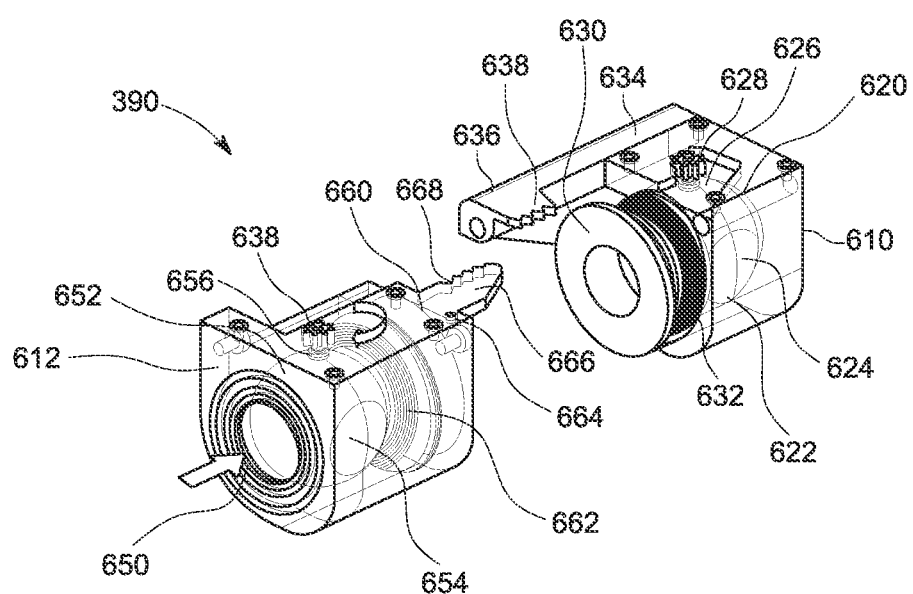

FIGS. 6A-6B are perspective views of one of the quick connectors 390 shown in FIG. 3 in a connected state and an unconnected state. The quick connector 390 includes a male connector 610 and a female connector 612. The male connector 610 includes an aperture 620 providing fluid communication to a ball valve 622 seated in the interior of the male connector 610. The ball valve 622 includes a through bore 624 and a stem 626 that is attached to a gear 628. Another aperture 630 provides fluid communication to an annular collar 632. The ball valve 622 may be rotated by the stem 626 and the gear 628. Thus, the ball valve 622 may be rotated between an open position and a closed position. The through bore 624 is aligned with the apertures 620 and 630 in the open position to allow fluid flow. The closed position is where the through bore 624 is rotated away from the apertures 620 and 630 and thus the ball valve 622 blocks fluid flow between the apertures 620 and 630. In this example, the aperture 620 is fluidly connected to one of the inlets or outlets of the pumps 310 or 312 in FIG. 3.

The male connector 610 also includes a lateral arm 634. The lateral arm 634 extends from one end of the male connector 610 and supports an extended tab 636 with a toothed edge 638.

The female connector 612 includes an aperture 650 providing fluid communication to a ball valve 652 seated in the interior of the female connector 612. The ball valve 652 includes a through bore 654 and a stem 656 that is attached to a gear 658. Another aperture 660 provides fluid communication to an annular collar 662. The ball valve 652 may be rotated by the stem 656 and the gear 658. Thus, the ball valve 652 may be rotated between an open position and a closed position. The through bore 654 is aligned with the apertures 650 and 660 in the open position to allow fluid flow. The closed position is where the through bore 654 is rotated away from the apertures 650 and 660 and thus the ball valve 652 blocks fluid flow between the apertures 650 and 660.

The female connector 612 also includes a lateral arm 664. The lateral arm 664 extends from one end of the female connector 612 and supports an extended tab 666 with a toothed edge 668.

When the male connector 610 is attached to the female connector 612 as shown in FIG. 6A, fluid may flow through the quick connector 390. The annular collars 632 and 662 are mated with each other to provide a fluid tight seal. The toothed edge 638 of the lateral arm 634 engages the gear 658 to hold the ball valve 652 in the open position. Similarly, the toothed edge 668 of the lateral arm 664 engages the gear 628 to hold the ball valve 622 in the open position. Coolant thus can flow between the aperture 620 and the aperture 650.

When the male connector 610 is separated from the female connector 612 as shown in FIG. 6B, coolant flow is cut off. When the male connector 610 is moved away from the female connector 612, the toothed edge 638 of the lateral arm 634 is moved and thus rotates the gear 658 to rotate the ball valve 652 to the closed position. The toothed edge 638 is then moved away entirely as the male connector 610 is completely separated from the female connector 612. The ball valve 652 remains in the closed position. Similarly, the toothed edge 668 of the lateral arm 664 is also moved and thus rotates the gear 628 to rotate the ball valve 622 to the closed position. The toothed edge 668 is then moved away entirely as the male connector 610 is completely separated from the female connector 612. The ball valve 622 remains in the closed position.

When the male connector 610 and the female connector 612 are reattached, the toothed edge 638 engages the gear 658 to rotate and fix the ball valve 652 to the open position. Simultaneously, the toothed edge 668 engages the gear 628 to rotate and fix the ball valve 622 to the open position. When the male connector 610 and the female connector 612 are fully attached, both ball valves 622 and 652 are open and thus fluid can flow between the aperture 620 and the aperture 650.

Figure 7:
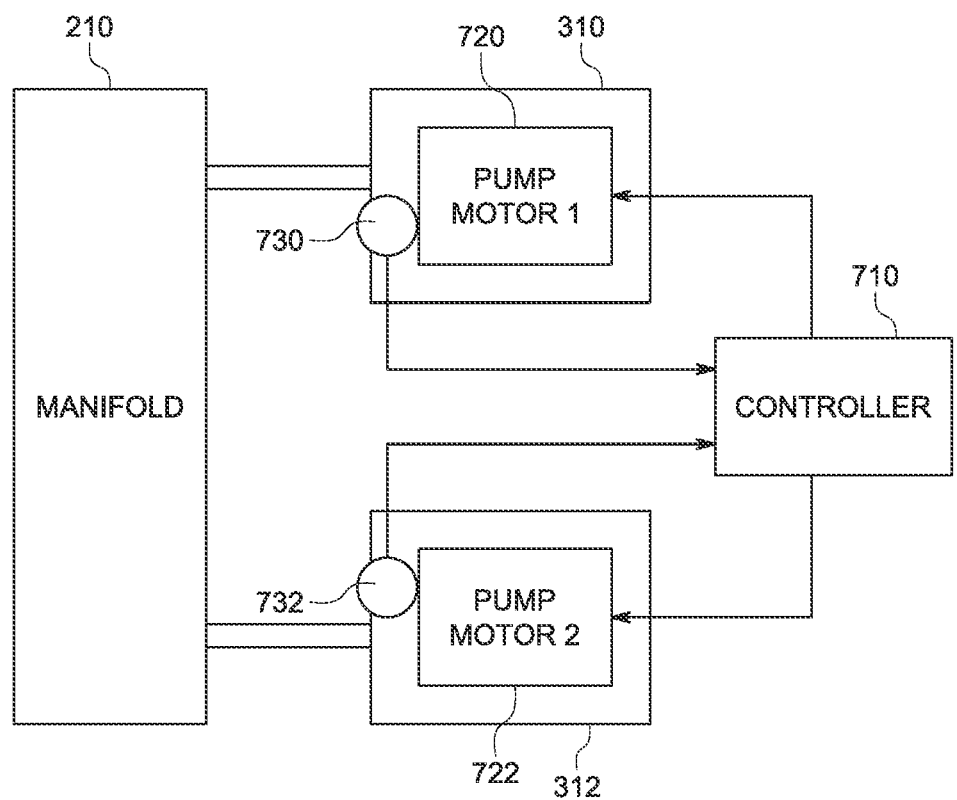
FIG. 7 is a block diagram of the pump controller and the pumps in FIG. 1, according to certain aspects of the present disclosure.

FIG. 7 is a block diagram of a pump control system 700 that controls the motor speed and thus the flow pressure of the pumps 310 and 312 in FIG. 3. The pump control system 700 includes a controller 710 that regulates the pumps 310 and 312 to maintain desired fluid pressure for circulating coolant through the manifold unit 210. The controller 710 provides speed control signals to a pump motor 720 of the pump 310 and a pump motor 722 of the pump 312. Thus, the controller 710 controls the flow rate of each of the pumps 310 and 312. The controller 710 sets the speed control signals based on the circulation of cooling fluid required by the computer system 100 in FIG. 1. The controller 710 also will adjust the speed control signals to the pump motors 720 and 722 if one of the pumps 310 or 312 is removed. Speed sensors 730 and 732 respectively are connected to the controller 710 to provide motor speed measurements, which may be correlated to flow measurements of the fluid being circulated through the manifold unit 210. In this example, a simple control routine may set the pumps 310 and 312 at half duty when the pump module 220 is operating normally. If a pump is removed, the routine will set the other pump to run at maximum duty to allow the same level of coolant circulation. Alternatively, flow rate sensors may be attached to the inlet 240 and the outlet 242 of the manifold unit 210. The overall flow of the coolant generated by the pumps 310 and 312 may be determined and the speed control signals may be adjusted accordingly.

Figure 8:
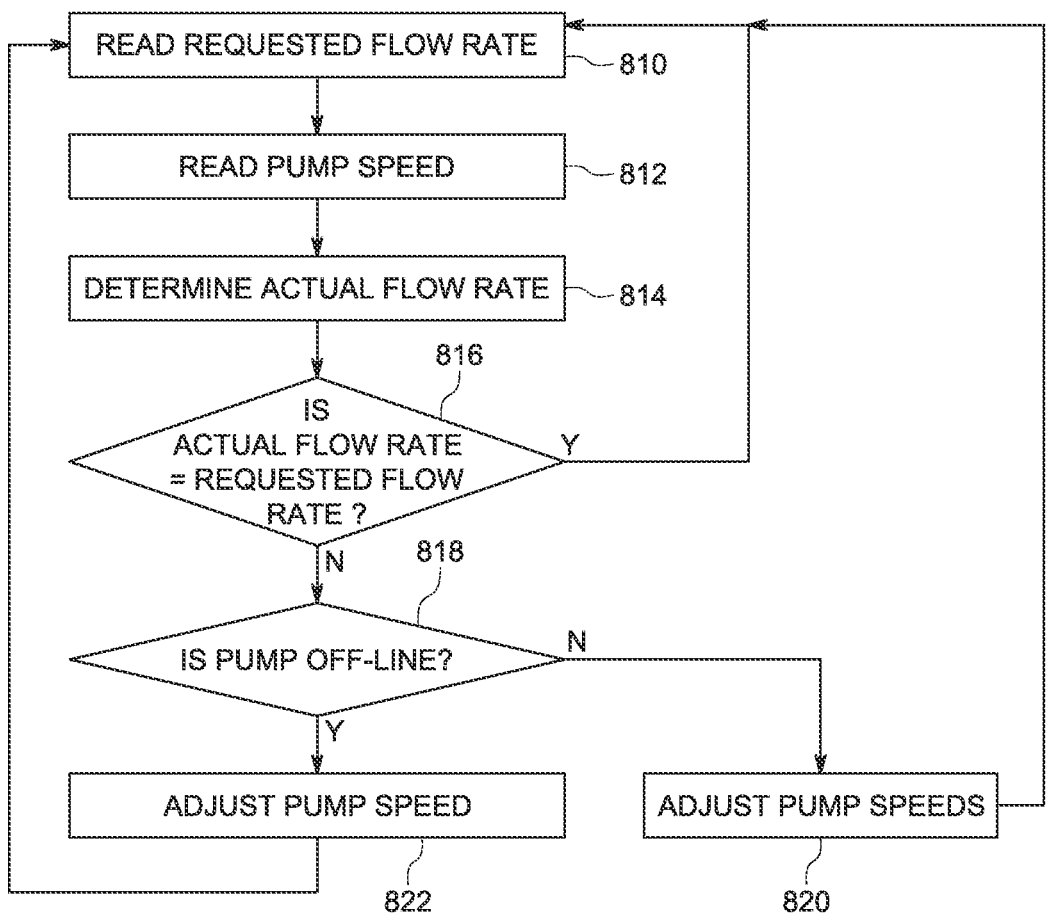
FIG. 8 is a flow diagram of a routine executed by the pump controller in FIG. 7, according to certain aspects of the present disclosure.

FIG. 8 is a routine that is representative of example machine-readable instructions for the controller 710 in FIG. 7 to perform control of the pumps 310 and 312. In this example, the machine-readable instructions comprise an algorithm for execution by: (a) a processor; (b) a controller; and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can, alternatively, be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic device, etc.). For example, any or all of the components of the interfaces can be implemented by software, hardware, and/or firmware. Also, some or all of the machine-readable instructions represented by the flowcharts may be implemented manually. Further, although the example routine is described herein, persons of ordinary skill in the art will readily appreciate that many other methods of implementing the example machine-readable instructions may alternatively be used.

The controller 710 reads the requested flow rate (810). The flow rate may be determined by cooling requirements that are requested from the computer components in the computer system 100 in FIG. 1. The controller 710 then determines the speed of the pumps 310 and 312 from the sensors 730 and 732 (812). The actual flow rate is determined from the speed of the pump motors read from the sensors 730 and 732 (814). The controller 710 then determines whether the actual flow rate is the same as the requested flow rate (816). If the actual flow rate is the same as the requested flow rate, the routine loops back to read the requested flow rate (810).

If the actual flow rate is different from the requested flow rate, the controller 710 determines whether one of the pumps is off-line (818). If neither pump is off-line, the controller 710 determines the pump speeds for both pumps that are required to produce the requested flow rate and the pump speeds are adjusted accordingly (820). The routine then loops back to reading the requested flow rate (810). If one pump is off-line, the controller 710 determines the pump speed for the remaining pump that is required to produce the requested flow rate and the pump speed of the remaining pump is adjusted accordingly (822). The routine then loops back to reading the requested flow rate (810).

Alternatively, the controller may be provided with the speed of the pump motor directly from the corresponding pumps. The routine then will determine the flow rate from the provided motor speed and determine whether the motor speed of the pump should be adjusted to achieve the desired flow rate accordingly.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A coolant distribution unit for circulating coolant to a heat-generating component, the coolant distribution unit comprising:
    a manifold unit having a supply connector to supply the coolant to the heat-generating component and a collection connector to collect the coolant from a heat exchanger;
    a first pump having an inlet coupled to the manifold unit and an outlet coupled to the manifold unit, the first pump circulating the coolant from the inlet of the first pump to the outlet of the first pump;
    a second pump having an inlet coupled to the manifold unit and an outlet coupled to the manifold unit, the second pump circulating the coolant from the inlet of the second pump to the outlet of the second pump, wherein the second pump may be disconnected from the manifold unit, while the first pump continues to circulate the coolant through the manifold unit; and
    quick connectors coupling the inlet of the first pump, the inlet of the second pump the outlet of the first pump, and the outlet of the second pump to the manifold unit, each of the quick connectors having a first ball valve connected to a first gear, a first lateral arm with a toothed edge; a second lateral arm with a toothed edge, and a second ball valve connected to a second gear, each ball valve having an open position allowing the coolant to flow, wherein the quick connectors of the inlet and outlet of the second pump close off the manifold unit from coolant leaks when the second pump is disconnected via the toothed edge of the first lateral arm of the respective quick connectors engaging the second gear and the toothed edge of the second lateral arm of the respective quick connectors engaging the first gear to respectively rotate the first and second ball valves to a closed position preventing coolant from flowing.

2. The coolant distribution unit of claim 1, wherein the manifold unit includes a merge manifold coupled to the inlet of the first pump and the inlet of the second pump and a separation manifold coupled to the outlet of the first pump and the outlet of the second pump.

3. The coolant distribution unit of claim 1, further comprising a third pump having an inlet coupled to the manifold unit and an outlet coupled to the manifold unit, the third pump circulating coolant through the manifold from the inlet of the third pump to the outlet of the third pump, wherein the third pump continues to circulate coolant when the second pump is disconnected from the manifold unit.

4. The coolant distribution unit of claim 1, further comprising a controller coupled to the first pump and the second pump, wherein the controller is configured to adjust circulation flow rate of the first pump when the second pump is disconnected.

5. The coolant distribution unit of claim 4, wherein the controller is a programmable logic device.

6. The coolant distribution unit of claim 1, wherein the heat-generating component includes a heat-generating computational component and internal conduits to circulate the coolant received from the manifold unit.

7. The coolant distribution unit of claim 6, wherein the heat-generating component is one of an application server, a storage server, a storage device, or a network switch.

8. The coolant distribution unit of claim 1, further comprising a housing having an open end, the housing holding the first and second pumps, wherein the first and second pumps may be removed from the housing from the open end.

9. A computer system comprising:
    a computer component having a heat-generating device, a conduit to circulate coolant, a hot coolant connector, and a cold coolant connector;
    a heat exchanger configured to receive hot coolant from the hot coolant connector and supply cooled coolant;
    a manifold unit fluidly coupled to the heat exchanger to receive the cooled coolant and supply the cooled coolant to the cold coolant connector of the computer component; and
    a pump module coupled to the manifold unit to exclusively provide pressure to circulate the coolant between the heat exchanger, the manifold unit, and the computer component, the pump module including:
        a first pump having an inlet coupled to the manifold unit and an outlet coupled to the manifold unit, the first pump circulating the coolant through the manifold from the inlet of the first pump to the outlet of the first pump;
        a second pump having an inlet coupled to the manifold unit and an outlet coupled to the manifold unit, the second pump circulating the coolant through the manifold from the inlet of the second pump to the outlet of the second pump, wherein the second pump may be disconnected from the manifold unit, while the first pump continues to circulate the coolant; and
        quick connectors coupling the inlet of the first pump, the inlet of the second pump the outlet of the first pump, and the outlet of the second pump to the manifold unit, each of the quick connectors having a first ball valve connected to a first gear, a first lateral arm with a toothed edge; a second lateral arm with a toothed edge, and a second ball valve connected to a second gear, each ball valve having an open position allowing the coolant to flow, wherein the quick connectors of the inlet and outlet of the second pump close off the manifold unit from coolant leaks when the second pump is disconnected via the toothed edge of the first lateral arm of the respective quick connectors engaging the second gear and the toothed edge of the second lateral arm of the respective quick connectors engaging the first gear to respectively rotate the first and second ball valves to a closed position preventing coolant from flowing.

10. The computer system of claim 9, wherein the manifold unit includes a merge manifold coupled to inlet of the first pump and the inlet of the second pump and a separation manifold coupled to the outlet of the first pump and the outlet of the second pump.

11. The computer system of claim 9, wherein the pump module further includes a third pump having an inlet coupled to the manifold unit and an outlet coupled to the manifold unit, the third pump circulating coolant through the manifold from the inlet of the third pump to the outlet of the third pump, wherein the third pump continues to circulate coolant when the second pump is disconnected from the manifold unit.

12. The computer system of claim 9, further comprising a controller coupled to the first pump and the second pump, wherein the controller is configured to adjust circulation flow rate of the first pump when the second pump is disconnected.

13. The computer system of claim 12, wherein the controller is a programmable logic device.

14. The computer system of claim 9, wherein the computer component includes internal conduits to circulate the coolant received from the manifold unit.

15. The computer system of claim 14, wherein the computer component is one of an application server, a storage server, a storage device, or a network switch.

16. The computer system of claim 9, further comprising a coolant distribution unit having a housing, wherein the housing holds the manifold unit and pump module.

17. The computer system of claim 9, further comprising a rack holding the computer component, the manifold unit and the pump module, wherein the rack includes a door holding the heat exchanger.

\* \* \* \* \*